(12) United States Patent
Muramatsu

(10) Patent No.: US 7,284,779 B2
(45) Date of Patent: Oct. 23, 2007

(54) ELECTRIC TWEEZERS

(75) Inventor: Naoki Muramatsu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 107 days.

(21) Appl. No.: 10/475,674

(22) PCT Filed: Nov. 13, 2002

(86) PCT No.: PCT/JP02/11839

§ 371 (c)(1),
(2), (4) Date: Oct. 23, 2003

(87) PCT Pub. No.: WO03/047816

PCT Pub. Date: Jun. 12, 2003

(65) Prior Publication Data

US 2004/0199206 A1   Oct. 7, 2004

(30) Foreign Application Priority Data

Nov. 27, 2001 (WO) ............... PCT/JP01/10324

(51) Int. Cl.
*B25B 9/00* (2006.01)
(52) U.S. Cl. .................................... 294/100
(58) Field of Classification Search ............. 294/99.2, 294/100, 86.4, 99.1; 606/210, 217, 218
See application file for complete search history.

(56) References Cited

U.S. PATENT DOCUMENTS

| 2,794,667 | A | * | 6/1957 | Bissitt | 294/50.7 |
| 5,176,690 | A | * | 1/1993 | Gross et al. | 606/133 |
| 5,332,275 | A | * | 7/1994 | Conway et al. | 294/100 |
| 5,458,387 | A | * | 10/1995 | Conway et al. | 294/100 |
| 5,895,084 | A | * | 4/1999 | Mauro | 294/100 |
| 5,899,910 | A | * | 5/1999 | Etman | 606/133 |
| 5,914,062 | A | * | 6/1999 | von der Heyde | 219/227 |
| 6,513,213 | B1 | * | 2/2003 | Muramatsu et al. | 29/25.35 |
| 6,691,586 | B2 | * | 2/2004 | Muramatsu | 74/25 |

FOREIGN PATENT DOCUMENTS

| WO | WO 99/30877 A1 | 6/1999 |
| WO | WO 00/45999 A1 | 10/2000 |

* cited by examiner

*Primary Examiner*—Patrick Mackey
*Assistant Examiner*—Esther O Okezie
(74) *Attorney, Agent, or Firm*—Sughrue Mion, PLLC

(57) ABSTRACT

Electric tweezers (1) include a case (60) for accommodating a motor (52), a finger (13) for releasing and holding an object, one end portion of which is connected and fixed to the case (60), and the other end portion (13*g*) of which enlarges a quantity of opening and closing of a tip portion according to a quantity of translational displacement of reciprocation, a switch (57) for rotating and stopping the motor (52), and a transformation mechanism (30) accommodated in the case (60), connected to a shaft (52*a*) of the motor (52), and transforming a rotation in one direction of the motor (52) into a quantity of translational displacement in a predetermined reciprocating direction with respect to the other end portion (13*g*) of the finger (13).

9 Claims, 10 Drawing Sheets

ELECTRIC TWEEZERS

TECHNICAL FIELD

The present invention relates to improvements in tweezers for holding a very small part. More particularly, the present invention relates to simple electric tweezers having a displacement enlarging mechanism.

BACKGROUND ART

The present inventor proposed a gripper having a very simple mechanism in the official gazette of International Patent Publication No. WO99/30877. This gripper is characterized in that a small quantity of translational movement is transformed into a quantity of bending displacement being enlarged tenfold or more at a tip of each finger of the gripper by applying a buckling phenomenon of a long column to the finger without using a specific displacement enlarging mechanism.

With this gripper, it becomes possible to softly hold a very small part. Further, since the size of this gripper is small and the weight is light, this gripper is suitably used for a robot hand.

However, the present inventor made investigations in earnest and found the following. In a case where the gripper is applied to the use for holding an object by conducting a predetermined opening and closing motion, a quantity of opening and closing a holding member for holding the object must be set at an appropriate value. Therefore, it is necessary to adjust the rotary angles of a motor in the forward and backward rotating directions so that a quantity of translational displacement of reciprocation at the other end of the holding member becomes a predetermined value. This operation is complicated.

DISCLOSURE OF THE INVENTION

The present invention has been made to solve the above problems. It is an object of the present invention to provide electric tweezers of a simple structure including a holding member which has a function of enlarging a quantity of translational displacement, and capable of opening and closing the holding member as predetermined by a simple structure.

The present invention provides electric tweezers including: a motor; a case for accommodating the motor; a holding member for releasing and holding an object, one end portion of which is connected and fixed to the case, and the other end portion of which enlarges a quantity of opening and closing of a tip portion according to a quantity of translational displacement of reciprocation; a switch means for rotating and stopping the motor; and a transformation mechanism accommodated in the case and connected to a shaft of the motor, the transformation mechanism transforming a rotation of the motor in one direction into a quantity of translational displacement in a predetermined reciprocating direction with respect to the other end portion of the holding member.

According to the electric tweezers described above, the transformation mechanism transforms the rotation in one direction of the motor into a predetermined quantity of translational displacement of reciprocation with respect to the other end portion of the holding member, and the switch means rotates and stops the motor. Further, a quantity of translational displacement of the other end portion of the holding member becomes a predetermined value so that a quantity of opening and closing of the holding member becomes constant. Accordingly, for example, it is possible to provide an advantage that electric tweezers capable of holding and releasing a constant object can be easily obtained.

The present invention further provides electric tweezers, in which the transformation mechanism includes: a cam connected to the shaft of the motor and including a lifting portion having a first recess portion or a first protruding portion; and a cam follower connected to the other end portion, transforming a rotation in one direction of the cam into a quantity of translational displacement in the predetermined reciprocating direction with respect to the other end portion, and having a second protruding portion or a second recess portion corresponding to the lifting portion.

According to the above electric tweezers having a simple structure, it is possible to obtain a transformation mechanism capable of transforming the rotation in one direction of the motor into a quantity of translational displacement in a predetermined reciprocating direction with respect to the other end portion of the holding member.

The present invention provides electric tweezers, in which the transformation mechanism includes: an eccentric member connected to the shaft of the motor, rotated in a predetermined direction, and provided with a pin at a position shifted from a rotary center thereof; and a connecting transformation member to which the pin is fixed, which is fixed to the other end portion, and which transforms a rotation in one direction of the pin into a quantity of translational displacement in the predetermined reciprocating direction with respect to the other end portion.

According to the electric tweezers having a simple structure, it is possible to obtain a transformation mechanism capable of transforming the rotation in one direction of the motor into a quantity of translational displacement in a predetermined reciprocating direction with respect to the other end portion of the holding member.

The present invention provides electric tweezers further including an elastic member accommodated in the case for pushing the cam or the cam follower to bring the lifting portion into contact with the second recess portion or the second protruding portion.

According to the electric tweezers having the above structure, a motion of the cam made by the rotation of the motor can be positively transmitted to the cam follower when the cam and the cam follower are made to come into contact with each other by the elastic member. Therefore, it is possible to provide an advantage that the electric tweezers are positively opened and closed.

The present invention provides electric tweezers, in which at least two guide protrusions used for guiding are provided on a side portion of the cam follower, and a guide groove for sliding the guide protrusion is provided in the case.

According to the electric tweezers having the above structure, the guide protrusion of the cam follower slides in the guide groove in the case. Therefore, it is possible to provide an advantage that the rotation of the cam follower made by the rotation of the cam is positively suppressed and the cam follower can make a translational displacement.

The present invention provides electric tweezers, in which an inclination is formed on at least one of the lifting portion, the second recess portion and the second protruding portion.

According to the electric tweezers having the above structure, it is possible to provide an advantage that the opening and closing speed of the holding member can be set at an appropriate value.

The present invention provides electric tweezers further including a reduction mechanism having a gear accommodated in the case for reducing the rotation of the motor.

According to the electric tweezers having the above structure, it is possible to provide an advantage that the holding member can maintain a state in which the holding member is closed even when the motor is stopped by the switch means.

The present invention provides electric tweezers, in which the switch means is provided on a surface of the case.

According to the electric tweezers having the above structure, since the switch means is provided in the case, it is possible to provide an advantage that the holding member can be opened and closed by the switch means while an operator is holding the electric tweezers with one hand.

The present invention provides electric tweezers further including a battery accommodated in the case for driving the motor.

According to the electric tweezers having the above structure, it is possible to provide an advantage that the electric tweezers can be operated even when no commercial electric power supply is available in the vicinity of the electric tweezers.

BEST MODE FOR CARRYING OUT THE INVENTION

First Embodiment

Figure 1:
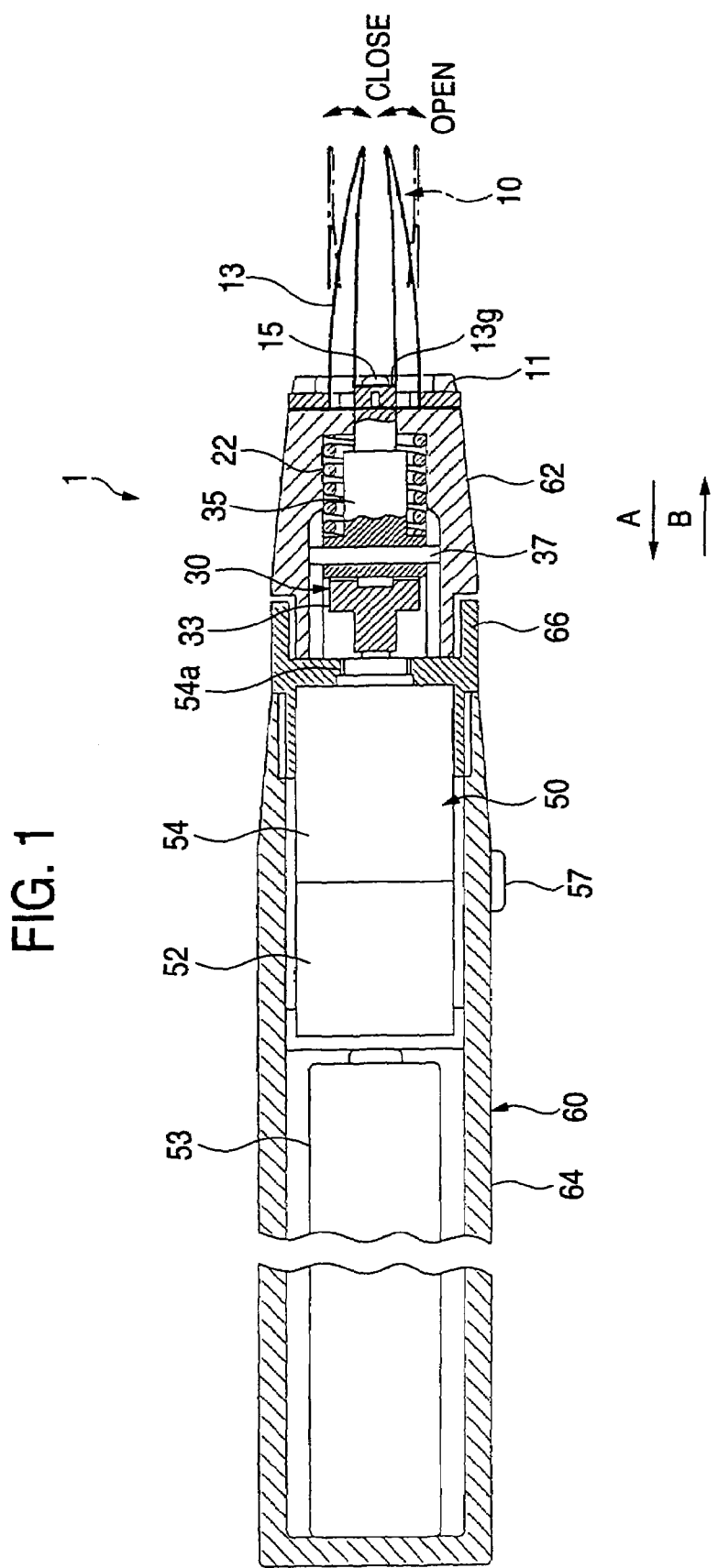
FIG. 1 is an overall sectional view of electric tweezers according to an embodiment of the present invention.
Figure 2:
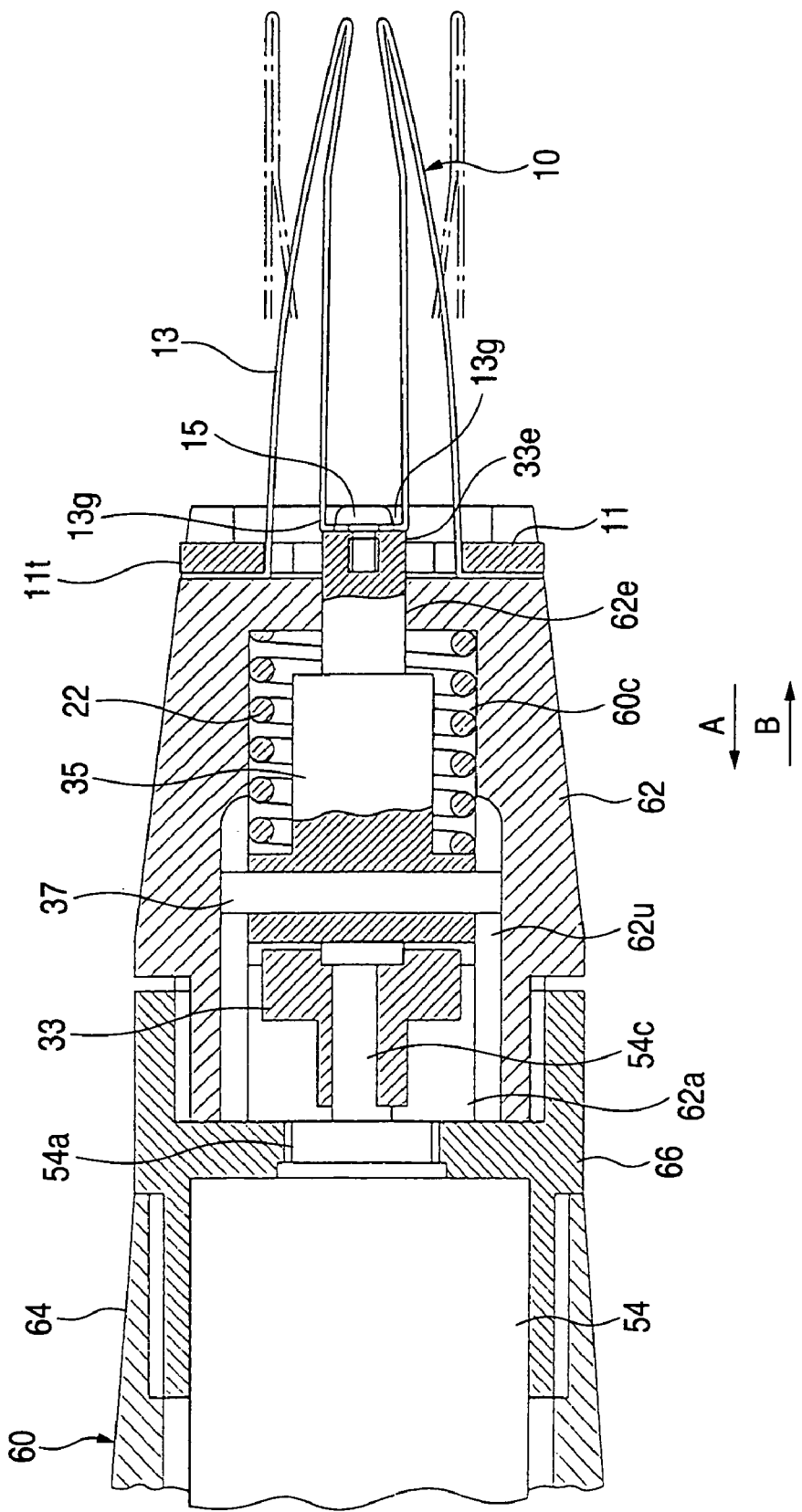
FIG. 2 is a partially enlarged view of the electric tweezers shown in FIG. 1.
Figure 3:
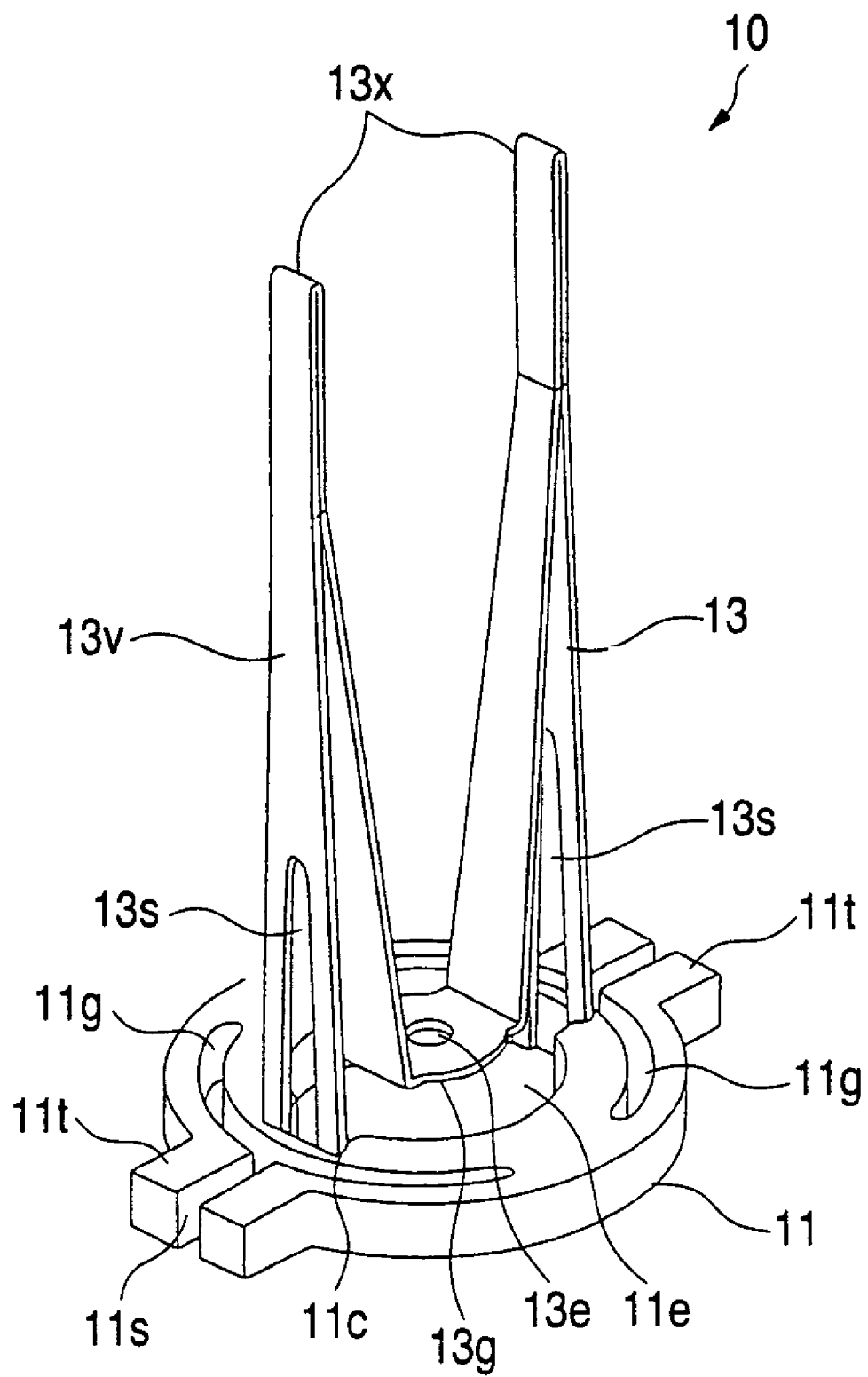
FIG. 3 is a perspective view of a finger unit used for the electric tweezers shown in FIG. 1.
Figure 4:
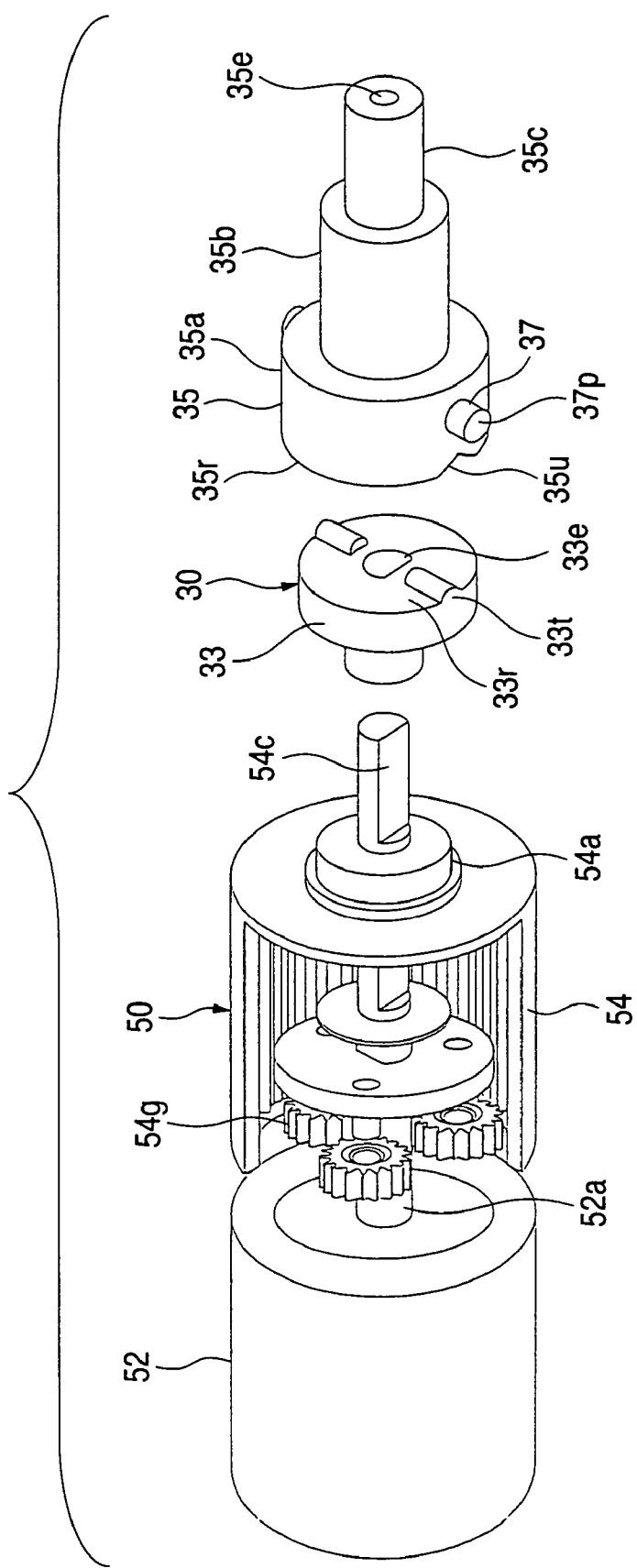
FIG. 4 is an exploded perspective view showing a cam, a cam follower, a reduction mechanism and a motor of the electric tweezers shown in FIG. 1.
Figure 5:
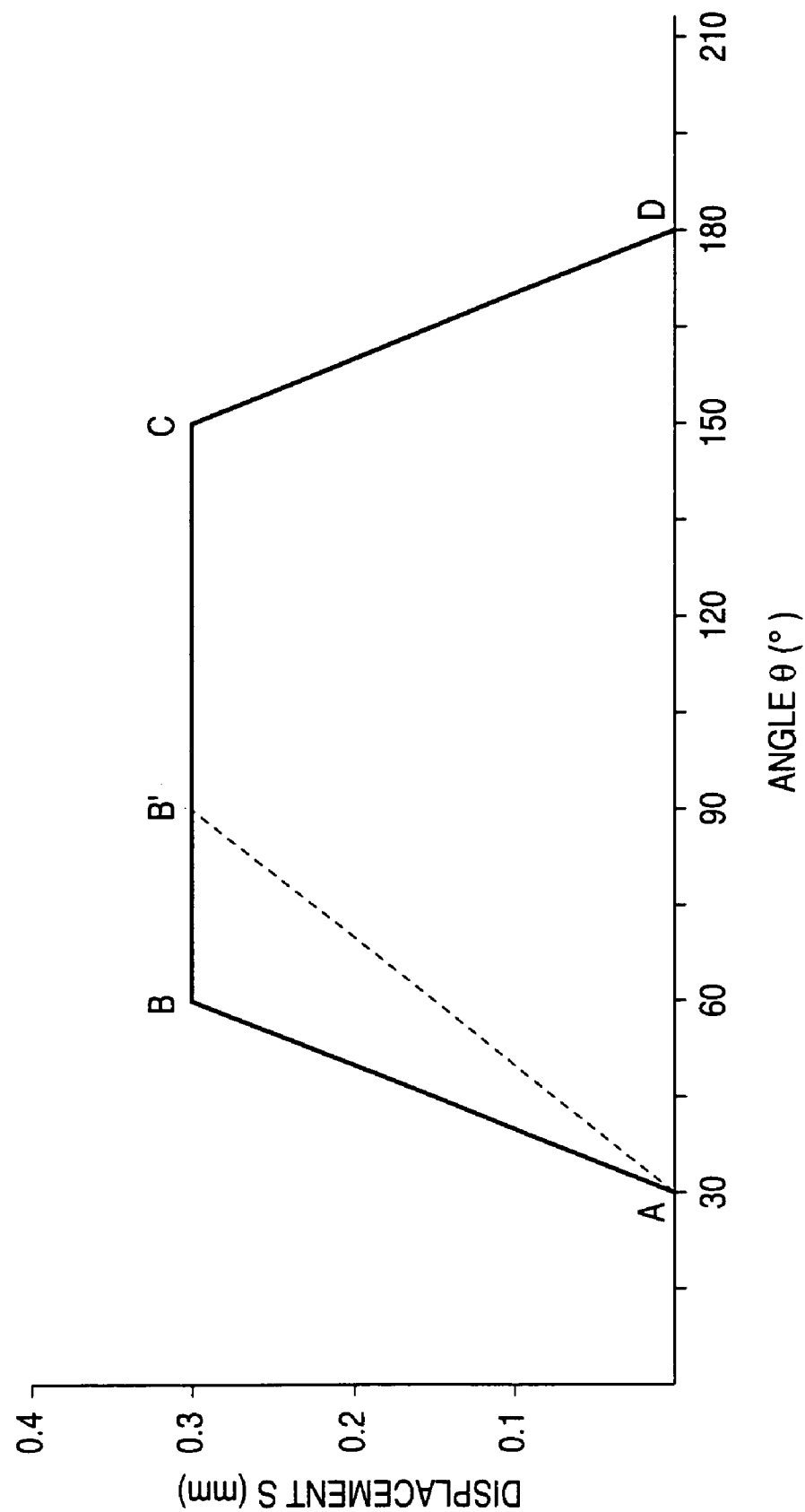
FIG. 5 is a displacement diagram of the cam used for the electric tweezers shown in FIG. 1.

Referring to FIGS. 1 to 5, explanations will be given of electric tweezers, an embodiment of the present invention. FIG. 1 is an overall sectional view of electric tweezers of an embodiment of the present invention, FIG. 2 is a partially enlarged view of the electric tweezers shown in FIG. 1, FIG. 3 is a perspective view of a finger unit used for the electric tweezers shown in FIG. 1, FIG. 4 is an exploded perspective view showing a transformation mechanism and a motor of the electric tweezers, and FIG. 5 is a displacement diagram of the cam used for the electric tweezers.

As shown in FIGS. 1 to 4, the electric tweezers 1 include: a holding finger 13 which is a holding member having one end portion and the other end portion; a drive section 50 having a motor 52 which is connected with a finger unit 10 and a common portion (the other end portion) 13g of the holding finger 13 and makes the common portion 13g conduct a translational displacement; a transformation mechanism 30 for transforming the rotation in one direction of a shaft 52a of the motor 52, that is, for transforming the rotation in a constant direction, which is one of the forward rotating direction and the backward rotating direction, into a translational displacement in a predetermined reciprocation direction with respect to the common portion 13g of the holding finger 13, the transformation mechanism 30 transforming into the forward translational displacement and the backward translational displacement which are the same magnitude; a screw 15 for fixing the common portion 13g of the holding finger 13 to an end portion of the transformation mechanism 30; and a case 60 for accommodating the drive section 50 and the transformation mechanism 30 and for fixing the finger unit 10.

As shown in FIG. 3, the finger unit 10 includes: the holding finger 13 which is the holding member; and a base member 11. The holding finger 13 has the common portion 13g formed at the center which is the other end portion having a hole 13e at the center. An outer piece of a V-shaped piece 13v has a slit 13s at the center. When the common portion 13g is pulled or returned according to the translational displacement, a tip 13x is displaced being enlarged, so that two V-shaped pieces 13v can be opened and closed. An object to be held is held or released by the V-shaped pieces 13v.

The base member 11 is formed into a flat washer shape having a hole 11e at the center. On the outer circumference of the base member 11, there are provided two protruding pieces 11t. In the base member 11, there are provided two cutout portions 11c which are engaged with the end portions of the V-shaped pieces 13v of the holding finger 13 while each of end portions of the holding finger 13 is being held by the two cutout portions 11c. In the protruding piece 11t, there is provided a slit 11s. When the side of the protruding piece 11t is held and pushed by means of an arcuate slit 11g which is formed continuously to the slit 11s, the protruding piece 11t is compressed and inserted into a groove (not shown) of a holder member 62. When the above holding is released, the protruding piece 11t is restored by a spring force and engaged with the groove.

When the finger unit 10 is fixed to the case 60, one end portion of the holding finger 13 is fixed (connected) to the case 60.

The transformation mechanism 30 is connected to the shaft 52a of the motor 52. The transformation mechanism 30 includes: a substantially disk-shaped cam 33 having a lifting portion composed of a first protruding portion 33t arranged in a contour 33r; and a cam follower 35 that is moved according to the movement of a lifting portion of the cam 33, the cam follower having a second recess portion 35u formed in a contour 35r, which is contacted and engaged with the protruding portion 33t of the cam 33.

The cam 33 is provided with a hole 33e engaged with a shaft 54c of a reduction mechanism 54, and the protruding portion 33t of the cam 33 has an inclination, the section of which is semicircular.

The cam follower 35 includes three columns, which are a base column 35a, middle column 35b and forward column 35c arranged in the order of the diameter. A straight pin 37 is stricken into the side portion of the base column 35a, so that two guide protrusions 37p are formed on the side portion. The forward column 35c has a screw hole 35e for fixing the common portion 13g of the holding finger 13. The recess portion 35u of the cam follower 35 also has an inclination, the section of which is elliptical, so that the recess portion 35u of the cam follower 35 can be engaged with the inclination of the protruding portion 33t of the cam 33 while defining a small gap. The reason why the inclination is provided is as follows. As shown in the displacement diagram of the transformation mechanism 30 of FIG. 5, the inclination is provided so that the translational displacement $\Delta S$ of the cam follower 35 with respect to the rotary angle $\Delta \theta$ of the cam 33 has a predetermined slope A→B and C→D, that is, the translational displacement $\Delta S$ of the cam follower 35 with respect to the rotary angle $\Delta \theta$ of the cam 33 has $\Delta S/\Delta \theta$. That is, the inclination is provided so that the opening and closing speed of the holding finger 13 can be an appropriate value by the inclination. Further, the inclination of the protruding portion 33t of the cam 33 and that of the recess portion 35u of the cam follower 35 may be made to be not symmetrical to each other. In this case, as shown by the dotted line A→B' in FIG. 5, the closing speed of the holding finger 13 may be made to be lower than the opening speed of the holding finger 13 so that the object to be held can be easily held.

The drive section 50 includes: a battery 53 for generating DC voltage which becomes a drive source of the motor 52; and a reduction mechanism 54 having a gear 54g for reducing the rotation of a shaft 52a of the motor 52 by a predetermined ratio of reduction. The reduction mechanism 54 includes an attaching screw 54a and the shaft 54c. The reduction mechanism 54 is provided for reducing the rotary speed of the motor 52 to an appropriate value so that a moving speed of the translational displacement in the common portion 13g of the holding finger 13 can be adjusted and the opening and closing speed of the holding finger 13 can be set at an appropriate value.

The reason why the reduction mechanism 54 is provided with a gear 54g is for preventing the holding finger 13, which is closed, from being opened, by maintaining the stopping state of the motor 52 even when the motor 52 is turned off by an electric power switch 57 while the object to be held is being held by the holding finger 13.

A well known planetary gear mechanism can be exemplified as the reduction mechanism 54.

The switch 57, which is a switch means, is fixed to the case 60. The switch 57 connects and disconnects the battery 53 of DC power supply with the motor 52 so as to rotate and stop the motor 52. While the polarity of the battery 53 is being kept as it is, the motor 52 can be rotated in a constant direction and then stopped.

In the case 60, the transformation mechanism 30 is accommodated. The case 60 includes: the holder member 62 for fixing the base member 11 of the finger unit 10; a case body 64 for accommodating the motor 52 and the battery 53; and a motor receiver 66 for fixing an end portion of the motor 52 and also fixing an end portion of the holder member 62.

In the holder member 62, there is provided a columnar hollow portion 62a. At the center of the holder member 62, there is provided a hole 62e into which the forward column 35c of the cam follower 35 is inserted. In the hollow portion 62a, two semicircular grooves 62u for sliding the guide protrusion 37p of the cam follower 35 are formed in the direction of translational displacement of the cam follower 35, and the length of the semicircular grooves 62u is longer than a quantity of translational displacement. In the hollow portion 62a, the transformation mechanism 30 and the coil-like compression spring 22 are accommodated. In this case, the reason why the guide protrusion 37p of the cam follower 35 moves while sliding in the groove 62u of the holder member 62 is to prevent the rotation of the cam follower 35 caused by the rotation of the cam 33.

When the base column 35a of the cam follower 35 is pushed in the direction of arrow A by the compression spring 22 which is an elastic member, the contour 33r of the cam 33 and the contour 35r of the cam follower 35 come into contact with each other. That is, the compression spring 22 is used for positively transmitting the motion of the cam 33, which is driven by the motor 52, to the cam follower 35. Due to the above structure, in a state in which the switch 57 is turned off, that is, in a state in which the motor 52 is stopped, the cam follower 35 is pushed in the direction of arrow A by the compression spring 22. Therefore, when the protruding portion 33t of the cam 33 is engaged with the recess portion 35u of the cam follower 35, the common portion 13g of the holding finger 13 is pulled in the direction of arrow A, and the holding finger 13 is closed and holds an object to be held. That is, the holding force of the holding finger 13 relies on the spring force of the compression spring 22, and the releasing force for releasing the holding finger 13 relies on the torque generated by the motor 52.

Referring to FIG. 1, explanations will be given of an operation of the electric tweezers configured as described above. When an operator presses the switch 57 under the condition that the holding finger 13 is opened, voltage of the battery 53 is applied to the motor 52, and the motor 52 starts rotating. The shaft 54c of the reduction mechanism 54 is rotated by the shaft 52a of the motor 52. At the same time, the cam 33 is rotated in the same direction at the same speed. The recess portion 35u of the cam follower 35, which is pushed in the direction of arrow A by the compression spring 22, is slid and engaged with the protruding portion 33t of the cam 33. Then, the common portion 13g of the holding finger 13 is pulled in the direction of arrow A and moved while making a translational displacement, and the V-shaped pieces 13V, which are opposed to each other, of the holding finger 13 are closed and holds the object to be held.

In this situation, when the operator releases the switch 57, an electric current flowing in the motor 52 is shut off and the motor 52 is stopped. At this time, the holding finger 13 tries to open by the spring force of the V-shaped pieces 13V of the holding finger 13, however, the rotation of the shaft 52a of the motor 52 is blocked by a frictional force of the gear 54g of the reduction mechanism 54. In this way, the V-shaped pieces 13V of the holding finger 13 are kept closed, and the object to be held is kept being held as it is Next, when the operator presses the switch 57, the shaft 52a of the motor 52 is rotated as described above, and the cam 33 is simultaneously rotated in the same direction at the same speed. The protruding portion 33t of the cam 33 and the recess portion 35u of the cam follower 35 are slid to each other and the engagement is released. Then, the common portion 13g of the holding finger 13 is returned in the direction of arrow B and moved while making a translational displacement, so that the V-shaped pieces 13V, which are opposed to each other, of the holding finger 13 can be opened and the object to be held can be released from the V-shaped pieces 13V.

In this embodiment, when the motor 52 is rotated in one direction, the holding finger 13 is opened and closed. Therefore, the operator is free from a finger force to open and close the tweezers for holding an object to be held such as parts.

The rotation in one direction of the motor 52 is transformed into a quantity of translational displacement in a predetermined reciprocating direction by the transformation mechanism 30. Therefore, a quantity of opening and closing the holding finger 13 can be kept constant. Especially, the electric tweezers 1 are suitably used for holding and releasing an object of the same profile. Further, the switch 57 has no function of changing over the polarity of the battery 53 for the forward and the backward rotation of the motor 52. Therefore, the wiring of the motor can be simplified.

Figure 6:
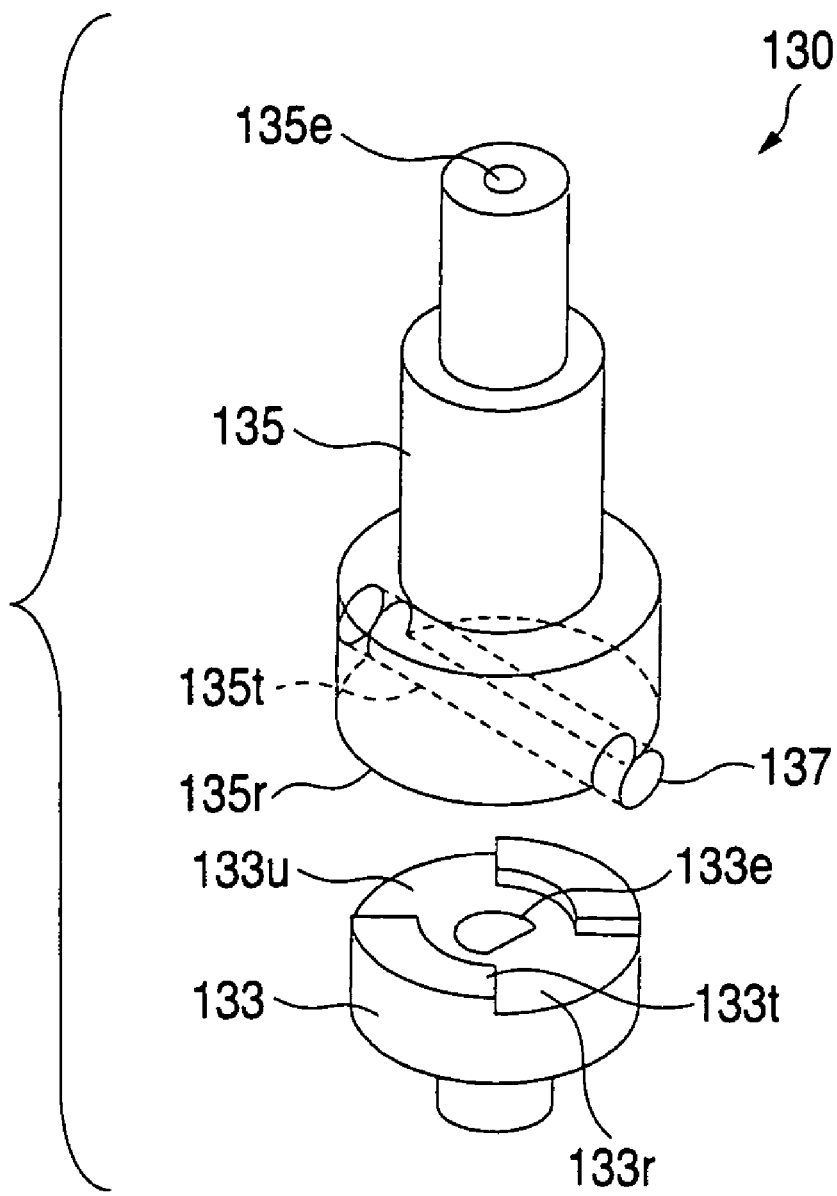
FIG. 6 is an exploded perspective view of a cam and a cam follower used for another embodiment of the present invention.

In this connection, instead of the transformation mechanism 30, a transformation mechanism 130 shown in FIG. 6 may be used. The transformation mechanism 130 is connected to the shaft 52a of the motor 52. The transformation mechanism 130 includes: a substantially disk-shaped cam 133 having a lifting portion, a contour 133r of which is composed of a recess portion 133u and a protruding portion 133t; and a cam follower 135, which is operated according to the movement of the lifting portion of the cam 133, a contour 135r of which is composed of a protruding portion 135t.

The protruding portion 135t of the cam follower 135 is composed of one portion of the straight pin 137 which is stricken into the side portion of the base column 135a.

The transformation mechanism 130 includes the cam follower 135 in which the protruding portion 135t is formed. On the other hand, the transformation mechanism 30 includes the cam follower 35 in which the recess portion 35u is formed.

In this embodiment, the switch 57 is arranged on the case 60 so that an operator can operate the electric tweezers 1 with one hand, however, the switch 57 may be provided separately from the case 60 and a lead may be drawn out from the case 60 and connected with the switch 57.

In this embodiment, DC motor 52 is used, however, AC motor may be used. When the rotary speed of the motor 52 is reduced to an appropriate value by an inverter or others, it is not necessary to provide the reduction mechanism 54.

The switch means for rotating and stopping the motor 52 is not limited to an electrical type but a mechanical type switch means may be used.

Second Embodiment

Figure 7:
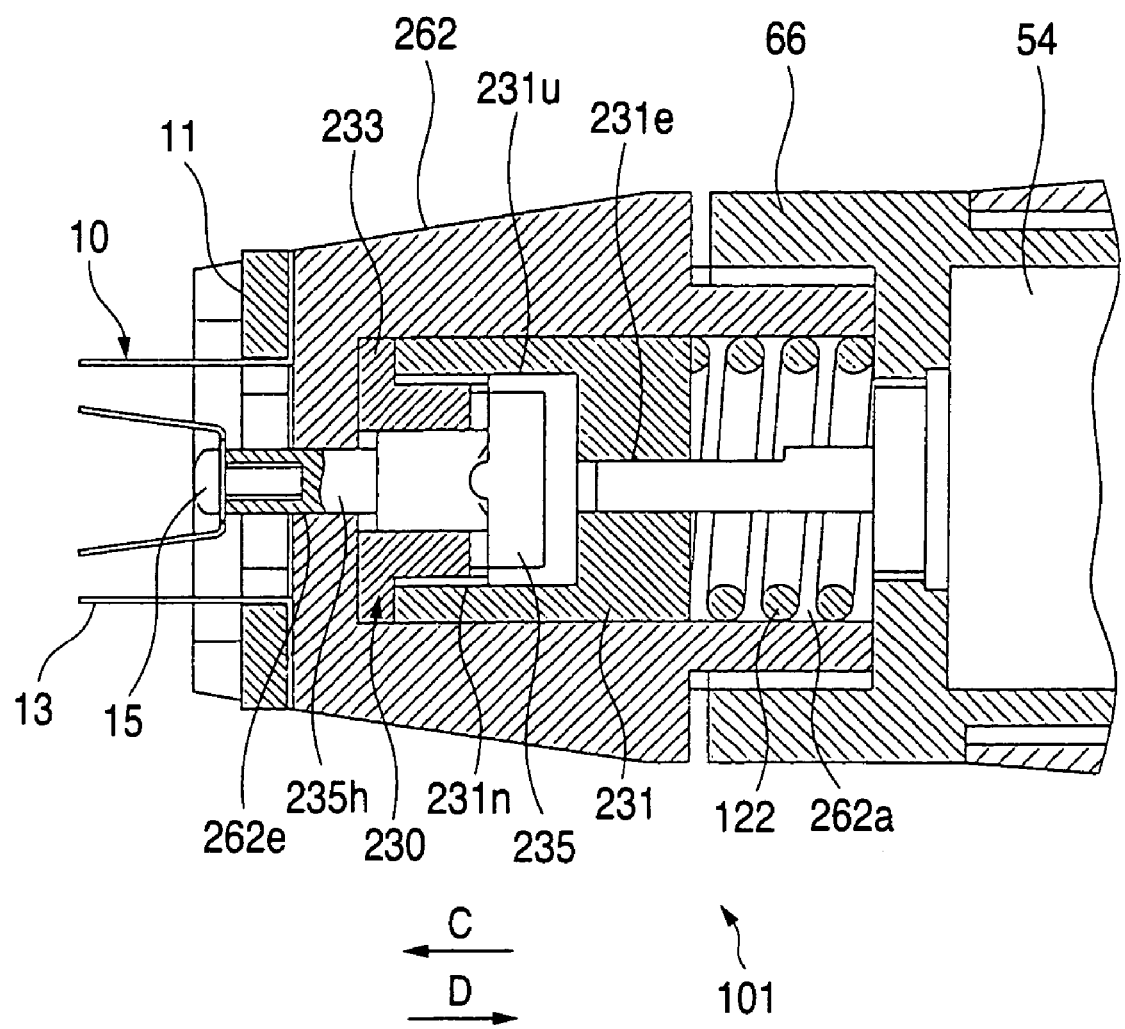
FIG. 7 is a sectional view showing a transformation mechanism of electric tweezers according to another embodiment of the present invention.
Figure 8:
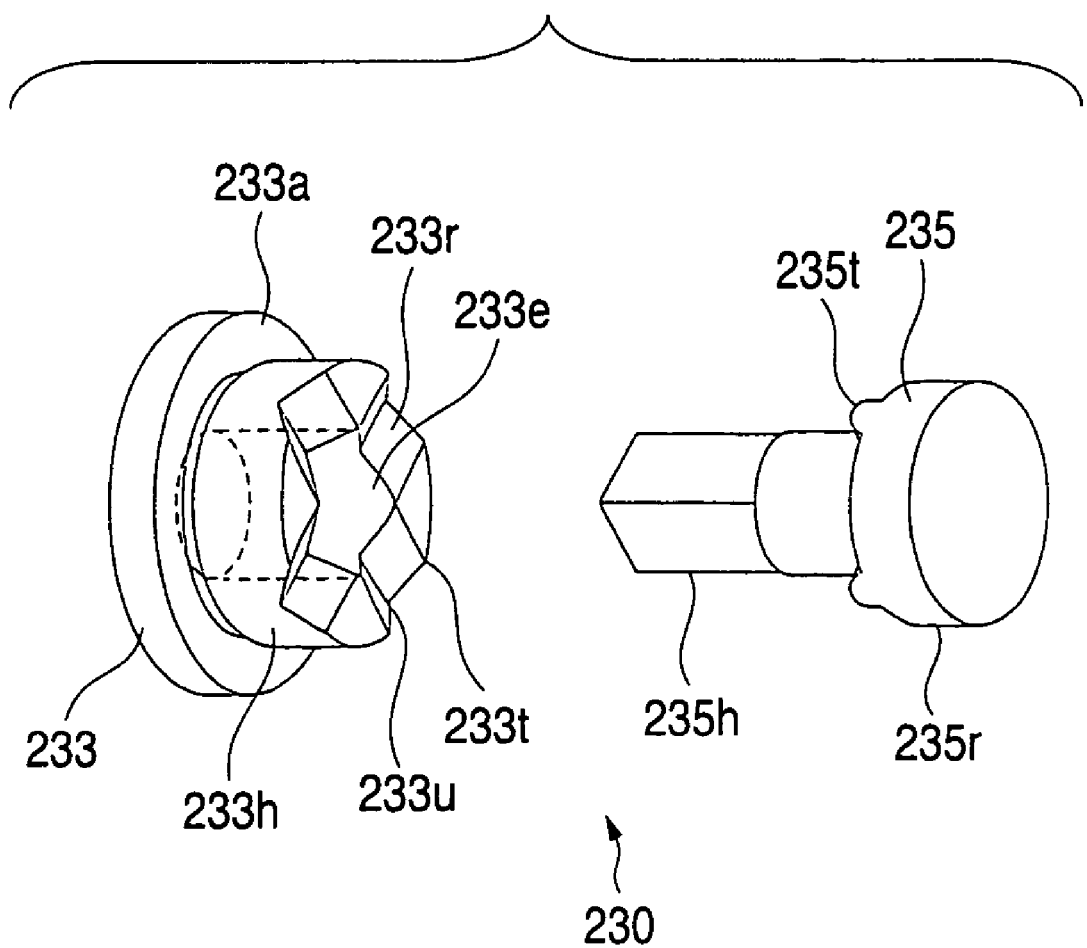
FIG. 8 is an exploded perspective view of the cam and the cam follower used for the electric tweezers shown in FIG. 7.

Referring to FIGS. 7 and 8, electric tweezers according to another embodiment of the present invention will be described below. FIG. 7 is a sectional view showing a transformation mechanism of the electric tweezers of another embodiment of the present invention. FIG. 8 is an exploded perspective view of the cam and the cam follower used for the electric tweezers shown in FIG. 7. In this connection, the drive section 50 and other members of this embodiment are the same as those of the first embodiment. Therefore, drawings and explanations are omitted here.

In FIGS. 7 and 8, a transformation mechanism 230 of electric tweezers 101 include: a driver 231 functioning as a transmitting member which is connected with the shaft of the motor 52 and transmits the rotation of the shaft of the motor 52; a cam 233 fixed to the driver 231; and a cam follower 235 which operates in accordance with the operation of the cam 233. The driver 231 is formed into a substantial glass-shape having a columnar cavity portion 231u. In the driver 231, there are provided a hole 231e, which is formed at the center of the bottom of the cavity portion 231u, and a female screw 231n formed at an inside of an upper end portion. The cam 233 includes: a columnar portion 233h, the profile of which is a substantial hat-shape, having a ring-shaped flange portion 233a and the columnar portion 233h, having a male screw on the outer circumference so that the male screw can be screwed with the female screw 231n of the driver 231; a first recess portion 233u, the profile of which is substantially triangular, and which is formed in a contour 233r that is an end face of the columnar portion 233h; a second protrusion 233t; and a square-column-shaped hole 233e. The cam follower 235 is formed into a substantial bolt-shape and has a square column portion 235h and four elliptical protrusions 235t formed in a contour 235r.

A holder member 262 includes: a columnar hollow portion 262a; and a square-column-shaped hole 262e formed at the center so that the hole 262e can be engaged with and fixed to the column portion 235h of the cam follower 235. Between the above hollow portion 262a and a ceiling face of a motor receiver 66, the transformation mechanism 230 and a coil-shaped compression spring 122 are accommodated. When the driver 231 and the cam 233 are pushed in the direction of arrow C by the compression spring 122, the contour 233r of the cam 233 and the contour 235r of the cam follower 235 come into contact with each other. Due to the above structure, the cam follower 235 is pushed in the direction of arrow C by the compression spring 122 under the condition the motor 52 is stopped. Therefore, the common portion 13g of the holding finger 13 is pulled back in the direction of arrow C under the engaging state in which the recess portion 233u of the cam 233 and the protrusion 235t of the cam follower 235 are engaged with each other while defining a small gap, and the holding finger 13 is opened.

On the other hand, when the recess portion 233u of the cam 233 and the protrusion 235t of the cam follower 235 are not engaged with each other, the common portion 13g of the holding finger 13 is pulled in the direction of arrow D so that the holding finger 13 is closed.

As described above, a force to open the holding finger 13 relies on the spring force of the compression spring 122, and a holding force of the holding finger 13 relies on the torque generated by the motor 52 because the torque generated by the motor 52 is sufficiently higher than the spring force of the compression spring 122. From the above viewpoint, the circumstances of the second embodiment are inverse to those of the first embodiment.

In the electric tweezers 101 configured as described above, the rotation of the shaft of the motor 52 is transmitted to the cam 233 and the cam follower 235 via the driver 231, that is, the electric tweezers 101 configured as described above operate in the substantially same manner as the first embodiment. When this embodiment is compared with the first embodiment, parts of the driver 231 are added to this embodiment, however, the function of this embodiment is the same as that of the first embodiment.

Third Embodiment

Figure 9:
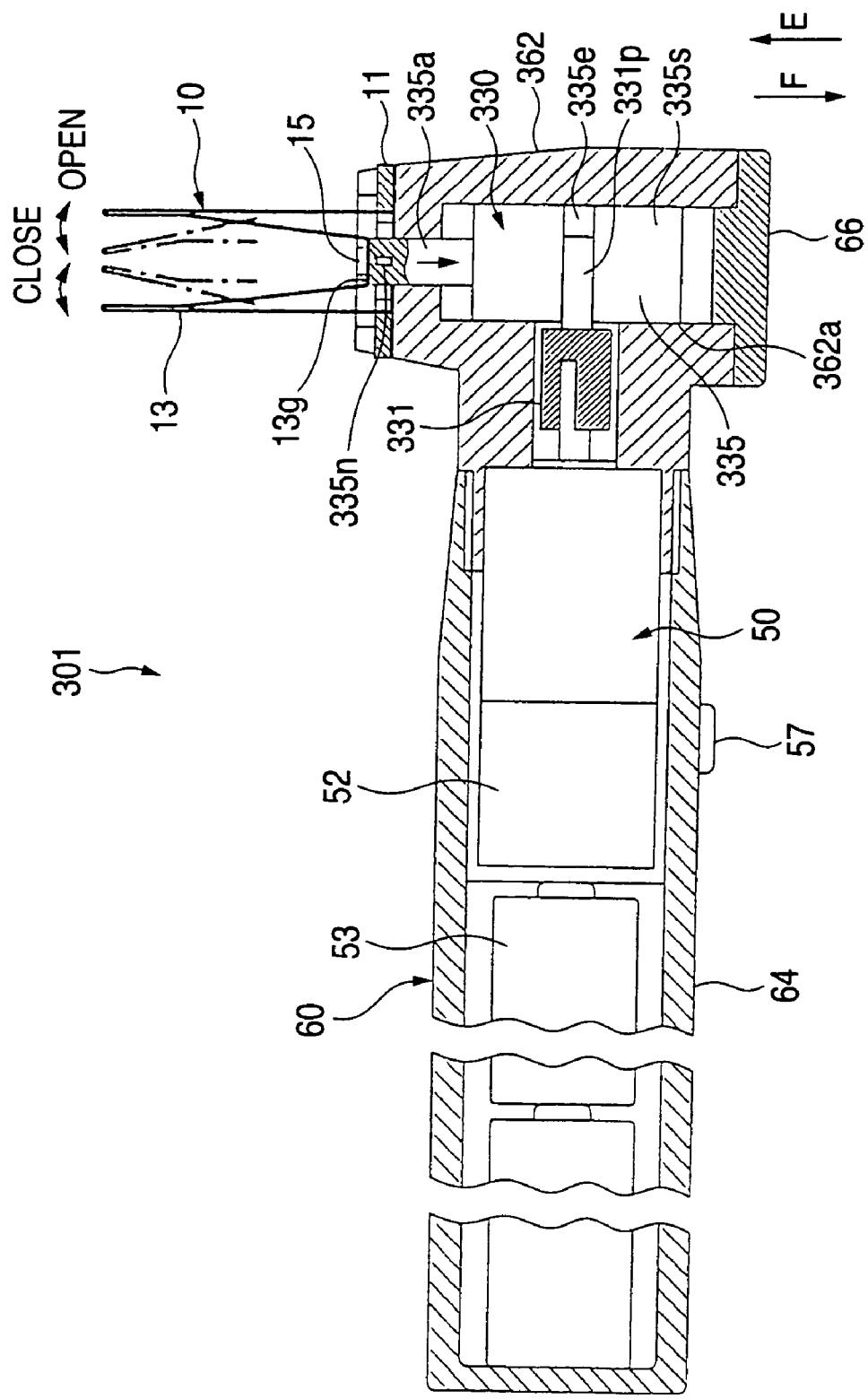
FIG. 9 is an overall sectional view showing electric tweezers according to still another embodiment of the present invention.
Figure 10:
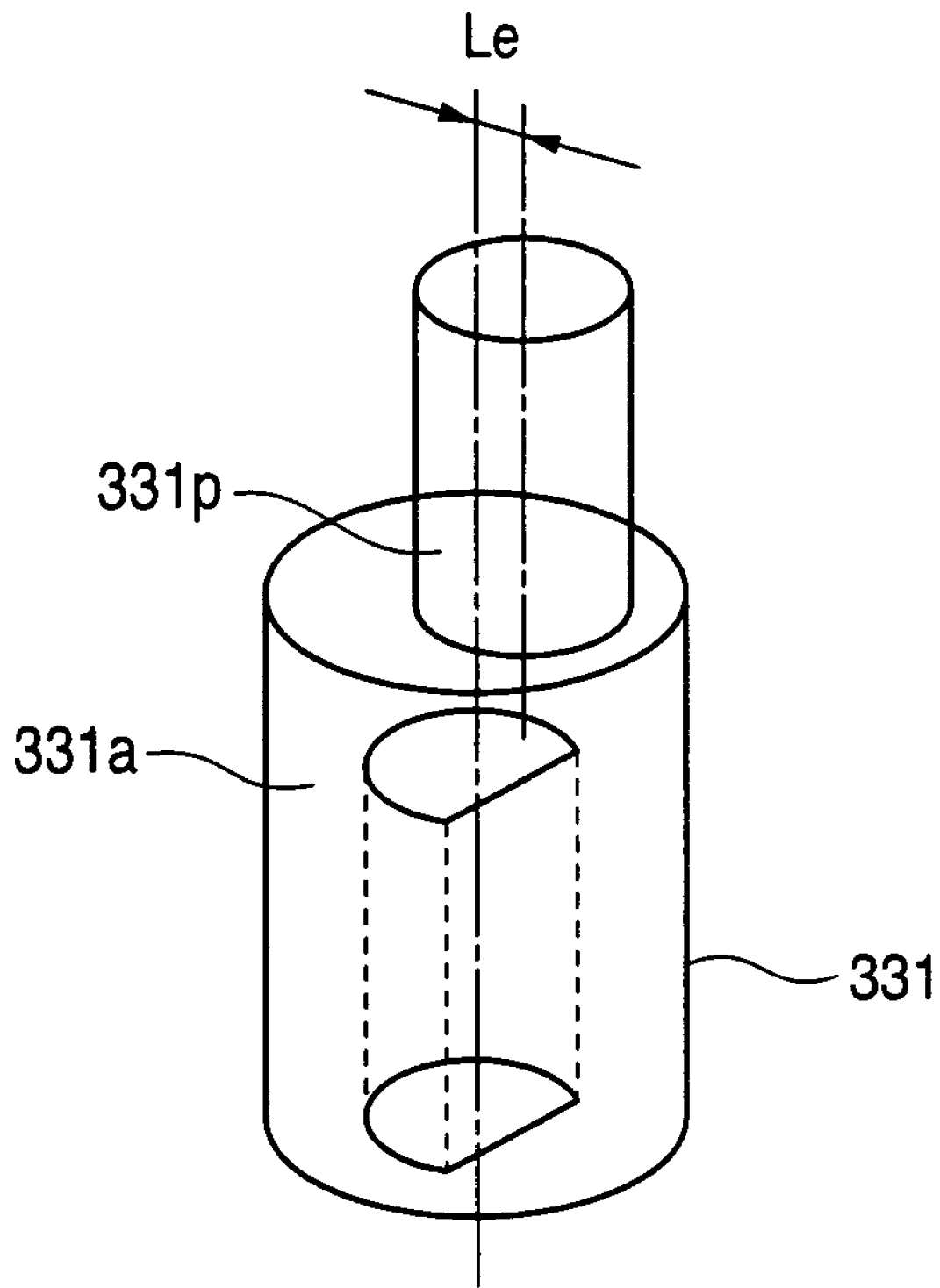
FIG. 10 is a perspective view showing an eccentric member of the electric tweezers shown in FIG. 9.

Referring to FIGS. 9 and 10, electric tweezers of another embodiment of the present invention will be described below.

FIG. 9 is an overall sectional view showing electric tweezers, and FIG. 10 is a perspective view showing an eccentric member of the electric tweezers shown in FIG. 9.

In FIGS. 9 and 10, the electric tweezers 301 include: a columnar connecting portion 331a connected with a shaft of a motor 52; an eccentric member 331 protruding from the connecting portion 331a and having a columnar pin 331p at a position distant from the center of the connecting portion 331a by distance Le; and a columnar connecting transformation member 335 which is arranged while making a substantially right angle with the eccentric pin 331p. The columnar connecting transformation member 335 fixes the eccentric pin 331p and transforms the rotation in one direction of the eccentric pin 331p into a translational displacement in a predetermined reciprocating direction. This columnar connecting transformation member 335 is fixed to the common portion 13g of the holding finger 13. The center of the connecting portion 331a also serves as the rotary center of the eccentric member 331.

The connecting transformation member 335 includes: a fixing portion 335a formed into a columnar shape for fixing the common portion 13g of the holding finger 13; and a sliding portion 335s, the size of which is one size larger than the fixing portion 335a. The fixing portion 335a includes a screw hole 335n for fixing the common portion 13g of the holding finger 13 by the screw 15. The connecting transformation member 335 includes a hole 335e to be engaged with the eccentric pin 331p of the eccentric member 331 so that the eccentric pin 331p of the eccentric member 331 can be fixed.

A holder member 362 includes a two-step-columnar hollow portion 362a in which the fixing portion 335a and the sliding portion 335s of the connecting transformation member 335 can be slidably accommodated. A cover 66 is set at an end portion of the holder member 362.

Operation of the electric tweezers configured as described above will be explained below. When an operator presses the switch 57 while the holding finger 13 is kept open, voltage is applied to the motor 52 by the battery 53 and the motor 52 starts rotating. The shaft of the motor 52 is rotated in one direction, and the eccentric pin 331p of the eccentric member 331 is rotated. Therefore, the eccentric pin 331p moves in the direction of arrow F by distance Le, and the connecting transformation member 335 moves in the holder member 362 by the same distance. Accordingly, the common portion 13g of the holding finger 13 is pulled in the direction of arrow F and makes a translational displacement. Therefore, the V-shaped pieces 13V of the holding finger 13, which are opposed to each other, are closed and hold an object to be held.

Next, when the operator presses the switch 57, the shaft 52b of the motor 52 is rotated as described above. At the same time, the eccentric member 331 is also rotated in the same direction at the same rotary speed. The eccentric pin 331p is rotated and moves in the direction of arrow E by length Le, and the connecting transformation member 335 also moves as described above. Accordingly, the common portion 13g of the holding finger 13 is returned in the direction of arrow E and makes a translational displacement, and the V-shaped pieces 13V of the holding finger 13, which are opposed to each other, are opened and release the object.

In this embodiment, the holding finger 13 can be opened and closed by the rotation of the eccentric pin 331p of the eccentric member 331 via the connecting transformation member 335. Accordingly, the structure of the electric tweezers 301 can be made relatively simple.

Further, the holding finger 13 can be opened and closed with respect to a direction making a substantially right angle with the direction of the shaft of the motor 52. Accordingly, in the case where the number of the V-shaped pieces 13v of the holding finger 13 is three or more, the holding finger 13 can be opened and closed while making a substantially right angle with an object to be held. Therefore, an operator can easily hold the case body 64.

INDUSTRIAL APPLICABILITY

As described above, the electric tweezers of the present invention are suitable for holding and releasing an object to be held.

The invention claimed is:

1. Electric tweezers comprising:
   a motor;
   a case for accommodating the motor;
   a holding member for releasing and holding an object, one portion of which is connected and fixed to the case, and another portion of which is connected and fixed to a transformation mechanism and enlarges a quantity of opening and closing of a tip portion according to a quantity of translational displacement of reciprocation;
   a switch for rotating and stopping the motor; and
   the transformation mechanism accommodated in the case and connected to a shaft of the motor, the transformation mechanism transforming a rotation of the motor in one direction into a quantity of translational displacement in a predetermined reciprocating direction with respect to the other end portion of the holding member.

2. The electric tweezers according to claim 1, wherein the transformation mechanism comprises:
   a cam connected to the shaft of the motor and including a lifting portion having a first recess portion or a first protruding portion; and
   a cam follower connected to the other end portion, transforming a rotation in one direction of the cam into a quantity of translational displacement in the predetermined reciprocating direction with respect to the other end portion, and having a second protruding portion or a second recess portion corresponding to the lifting portion.

3. The electric tweezers according to claim 1, wherein the transformation mechanism comprises:
   an eccentric member connected to the shaft of the motor, rotated in a predetermined direction, and provided with a pin at a position shifted from a rotary center thereof; and
   a connecting transformation member to which the pin is fixed, which is fixed to the other end portion, and which transforms a rotation in one direction of the pin into a quantity of translational displacement in the predetermined reciprocating direction with respect to the other end portion.

4. The electric tweezers according to claim 2, further comprising an elastic member accommodated in the case for pushing the cam or the cam follower to bring the lifting portion into contact with the second recess portion or the second protruding portion.

5. The electric tweezers according to claim 2, wherein at least two guide protrusions used for guiding are provided on a side portion of the cam follower, and a guide groove for sliding the guide protrusion is provided in the case.

6. The electric tweezers according to claim 2, wherein an inclination is formed on at least one of the lifting portion, the second recess portion and the second protruding portion.

7. The electric tweezers according to claim 1, further comprising a reduction mechanism having a gear accommodated in the case for reducing the rotation of the motor.

8. The electric tweezers according to claim 1, wherein the switch is provided on a surface of the case.

9. The electric tweezers according to claim 1, further comprising a battery accommodated in the case for driving the motor.

* * * * *